United States Patent
Han et al.

(10) Patent No.: US 7,586,034 B2
(45) Date of Patent: Sep. 8, 2009

(54) DISPLAY DEVICE INTEGRATED WITH SOLAR CELLS AND METHOD OF FABRICATING THE SAME

(75) Inventors: In-Taek Han, Seoul (KR); Jong-Min Kim, Suwon-si (KR); Min-Jong Bae, Anyang-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 767 days.

(21) Appl. No.: 11/062,596

(22) Filed: Feb. 22, 2005

(65) Prior Publication Data

US 2005/0183764 A1    Aug. 25, 2005

(30) Foreign Application Priority Data

Feb. 21, 2004    (KR) .................... 10-2004-0011652

(51) Int. Cl.
*H01L 31/042*    (2006.01)
(52) U.S. Cl. .................. 136/244; 313/504; 313/506; 313/498
(58) Field of Classification Search .............. 136/244; 313/504, 506, 498
See application file for complete search history.

(56) References Cited

U.S. PATENT DOCUMENTS

| | | | | |
|---|---|---|---|---|
| 5,084,365 A | * | 1/1992 | Gratzel et al. ............... | 429/111 |
| 5,739,545 A | * | 4/1998 | Guha et al. .................. | 257/40 |
| 5,886,688 A | * | 3/1999 | Fifield et al. ................ | 345/206 |
| 6,956,066 B2 | * | 10/2005 | Vazquez et al. .............. | 521/50 |
| 7,063,902 B2 | * | 6/2006 | Kikuchi et al. .............. | 313/512 |
| 2002/0197474 A1 | * | 12/2002 | Reynolds .................... | 428/398 |

* cited by examiner

*Primary Examiner*—Alexa D Neckel
*Assistant Examiner*—Xiuyu Tai
(74) *Attorney, Agent, or Firm*—Robert E. Bushnell, Esq.

(57) ABSTRACT

A solar cell integrated display device with a solar cell attached to one side of a display device and a method of fabricating the same. The solar cell integrated display device includes an emissive display device unit that includes a first transparent substrate, a first transparent electrode deposited on the transparent substrate, a second transparent electrode facing the first transparent electrode, and a light emitting layer between the first transparent electrode and the second transparent electrode and a polymer membrane coated on the second transparent electrode. The polymer membrane includes CNT, which allows for a smooth flow of electrons. A solar cell unit that supplies power to the display device unit is stacked on the polymer membrane.

17 Claims, 8 Drawing Sheets

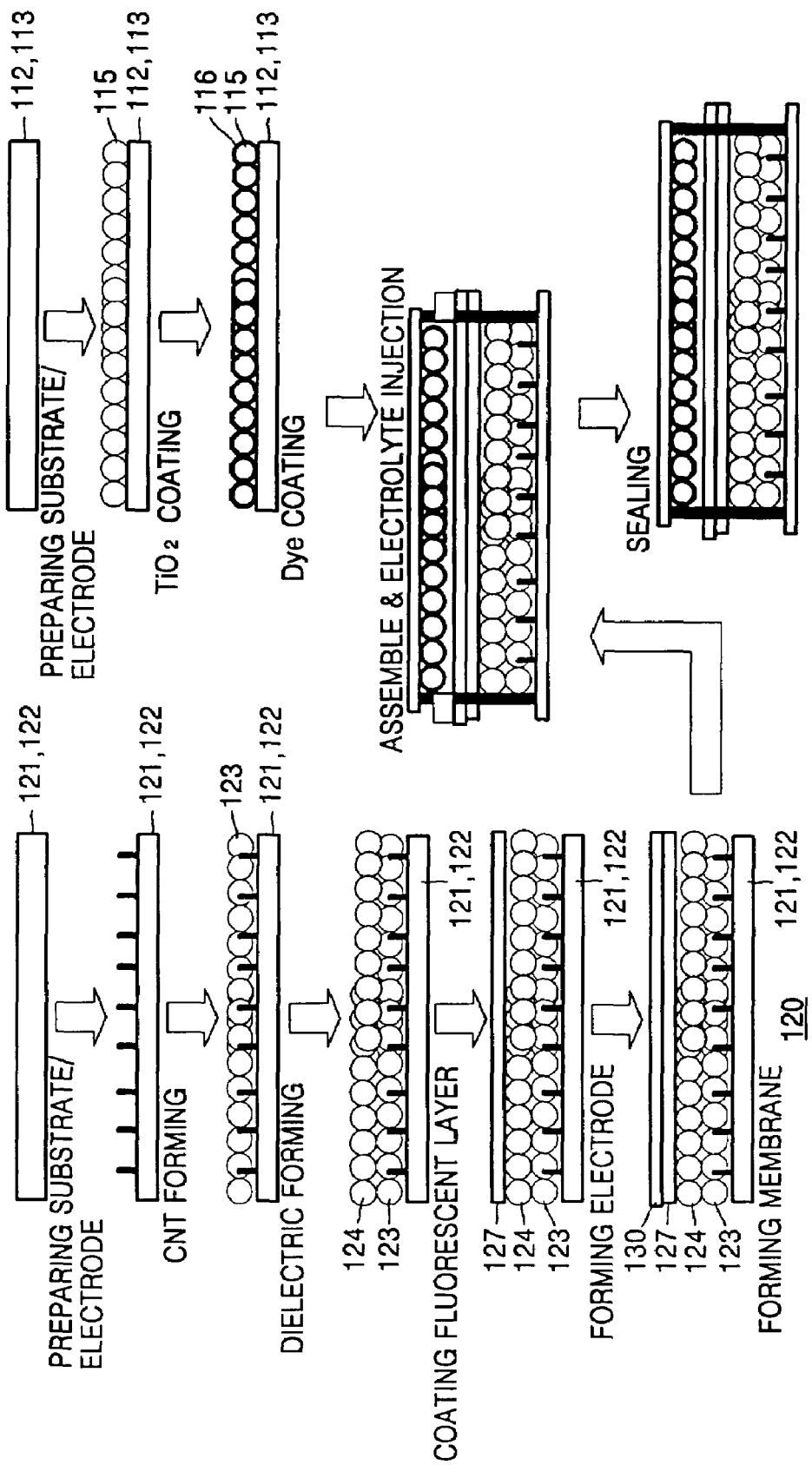

DISPLAY DEVICE INTEGRATED WITH SOLAR CELLS AND METHOD OF FABRICATING THE SAME

CLAIM OF PRIORITY

This application makes reference to, incorporates the same herein, and claims all benefits accruing under 35 U.S.C. §119 from an application for DISPLAY DEVICE INTEGRATED WITH SOLAR CELLS AND METHOD OF FABRICATING THE SAME earlier filed in the Korean Intellectual Property Office on 21 Feb. 2004 and there duly assigned Serial No. 10-2004-0011652.

BACKGROUND OF THE INVENTION

1. Field of the Invention

The present invention relates to a display device integrated with solar cells and a method of fabricating the same, and more particularly, to a display device integrated with solar cells on which a solar cell is integrated on a side of an emissive display device and a method of fabricating the same.

2. Description of the Related Art

Generally, an emissive display device can be an inorganic electro luminescent (IEL), an organic electro luminescent (OEL), an organic light emitting display (OLED) or a plasma display panel (PDP). In each of these display devices, light is generated in the active layer and propagates on all directions. However, since a display panel can only be viewed from one side, generated rays that travel towards the screen can be viewed while all other rays that do not travel towards the screen are not viewed and are thus wasted. What is needed is a display that makes better use of these rays that are generated but not viewed.

Sometimes a display may be formed with a solar cell. The solar cell receives sun light and converts it to electricity. The display panel uses electricity and produces visible images. However such a combination device allows operation of only one of the display and the solar cell at any one point in time. Such units are also bulky in volume as they consume a lot of space. Further, they have lots of wiring making such devices complicated. The wires generate noise which further disrupts operation of the device and other devices in the vicinity. Therefore, what is also needed is a combination device that is compact, does not have lots of wiring and that both the solar cells and the display can operate simultaneously.

SUMMARY OF THE INVENTION

It is therefore an object of the present invention to provide an improved solar cell integrated display device.

It is further an object of the present invention to provide a method of making the improved solar cell integrated display device.

It is also an object of the present invention to provide a solar cell integrated display device where both the display and the solar cell can operate simultaneously.

It is further an object of the present invention to provide method of making an integrated solar cell display device where both the display and the solar cell can function at the same time.

It is still an object of the present invention to provide a solar cell integrated display device that improves the energy efficiency by using light emitted from the display to generate electricity in the solar cell and a method of fabricating the same.

It is yet an object of the present invention to provide a solar cell integrated display device that prevents malfunctions of the display device by fabricating the solar cell in a single-body without complicated wiring and complicated circuits.

It is also an object of the present invention to provide an solar cell integrated display device having a compact size and a method of fabricating the same.

It is yet an object of the present invention to provide a solar cell integrated display device that does not require an external driving power source to operate.

These and other objects can be achieved by a solar cell integrated display device having an emissive display device unit that has a first transparent substrate, a first transparent electrode deposited on the transparent substrate, a second transparent electrode facing the first transparent electrode, and a light emitting layer between the first transparent electrode and the second transparent electrode. In addition, the solar cell integrated display device has a polymer membrane coated on the second transparent electrode, the polymer membrane having CNT (carbon nanotubes) mixed therein to allow for a smooth flow of electrons, and a solar cell unit that supplies power to the display device unit and stacked on the polymer membrane.

Here, the solar cell unit includes a second transparent substrate, a third transparent electrode deposited on the second transparent substrate, an optical catalyst coated on the third transparent electrode, an optical activation material that emits electrons when excited by sunlight and an electrolyte that transfers electrons.

According to an aspect of the present invention, there is provided a method of fabricating a solar cell integrated display device, including preparing an emissive display device unit by sequentially stacking a first transparent electrode, a light emitting layer, and a second transparent electrode on a first transparent substrate, coating a polymer membrane having CNTs mixed therein on the second transparent electrode to allow for a smooth flow of electrons. A solar cell unit is prepared by sequentially forming a second transparent substrate, a third transparent electrode on the second transparent substrate, an optical catalyst coated on the third transparent electrode and an optical activation material coated on the optical catalyst. The solar cell unit is assembled and attached to the display device unit so that the optical catalyst faces the polymer membrane, and a space between the optical catalyst and the polymer membrane is sealed after filling the space with an electrolyte.

Here, the formation of the coating of the polymer membrane, in which CNT is mixed therein, on the second transparent electrode further includes forming polyimide precursors by dissolving a powder state of diisocyanate and a powder state of dianhydride in DMAc solvent, mixing a CNT powder with the polyimide precursors, coating the polyimide precursors in which the CNT is included onto the second transparent electrode and heating the coated polyimide precursors causing $CO_2$ to be released causing the CNT to penetrate into the pores where the $CO_2$ has left.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 6 is a schematic drawing illustrating a method of fabricating a solar cell integrated display device according to the present invention;

DETAILED DESCRIPTION OF THE INVENTION

Emissive display devices are generally divided into transmission type and reflection type. The transmission type display device is a display device where light from a surface of the light emitting source material that is recognized by a human visual recognition system must travel through the light emitting source material.

Figure 1A:
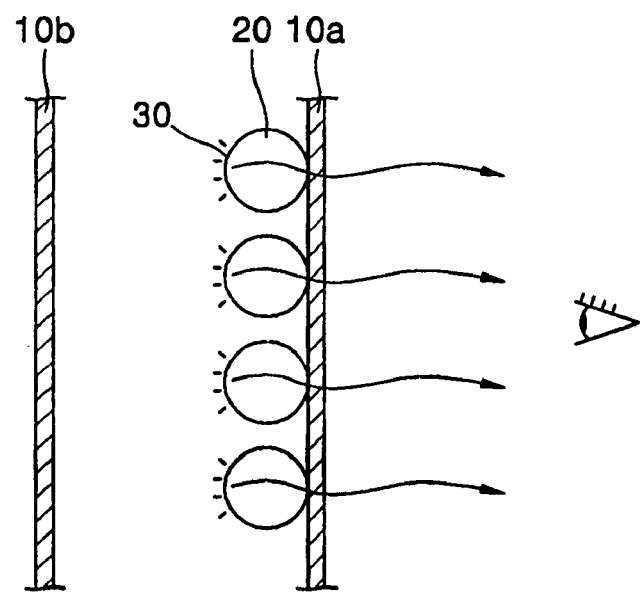
FIGS. 1A and 1B are schematic drawings illustrating two types of solar cell integrated display devices.

Turning now to the figures, FIG. 1A is a schematic drawing illustrating a transmission type display device. As depicted in FIG. 1A, the light originates from a surface 30 of a light emitting source material 20 and is transmitted through the light emitting source material 20 and through a substrate 10a to reach the human visual recognition system.

Figure 1B:
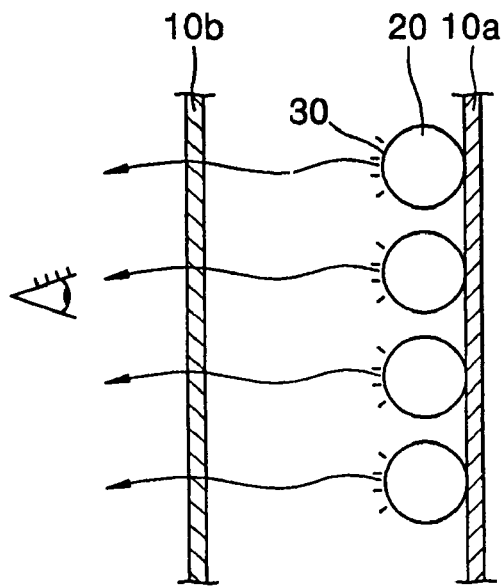

Turning now to FIG. 1B, FIG. 1B illustrates a reflection type display device. As depicted in FIG. 1B, light emitted from the surface 30 of the light emitting source material 20 does not travel through the light emitting source material to reach the human visual recognition system. Instead, light travels away from the light emitting source material 20 and then through the substrate 10b to reach the a human eye.

In a sense, the transmission-type light and the reflection-type light always coexist since light emitted from the light emitting source material is radiated in all directions. That is, all emissive display devices have the transmission-type light and the reflection-type light. However, the efficiency of a display device is typically 50%, since the display device uses only one of the transmission-type light and the reflection-type light. Therefore, much more power than what is actually used for displaying has to be supplied to the display device.

Display devices using solar cells as a power source instead of an external power source have been disclosed by employing the solar cell on a back side of the display device. Electricity generated by the solar cells from exposure to sunlight is stored in an energy storage device, such as a capacitor, and is then supplied to the display device through a wire. However, a display device having solar cells requires a large volume since the display device panel and the solar cell panel are assembled after manufacturing them separately. Also, there are many steps in the manufacturing process, thus increasing manufacturing costs. Wiring and circuits for connecting the solar cells to the display device are very complicated. Moreover, as more electricity is generated from sunlight, the greater the electromagnetic field is between the solar cells and the display device, thus increasing the number of malfunctions of the device and potential harm to humans.

Figure 2:
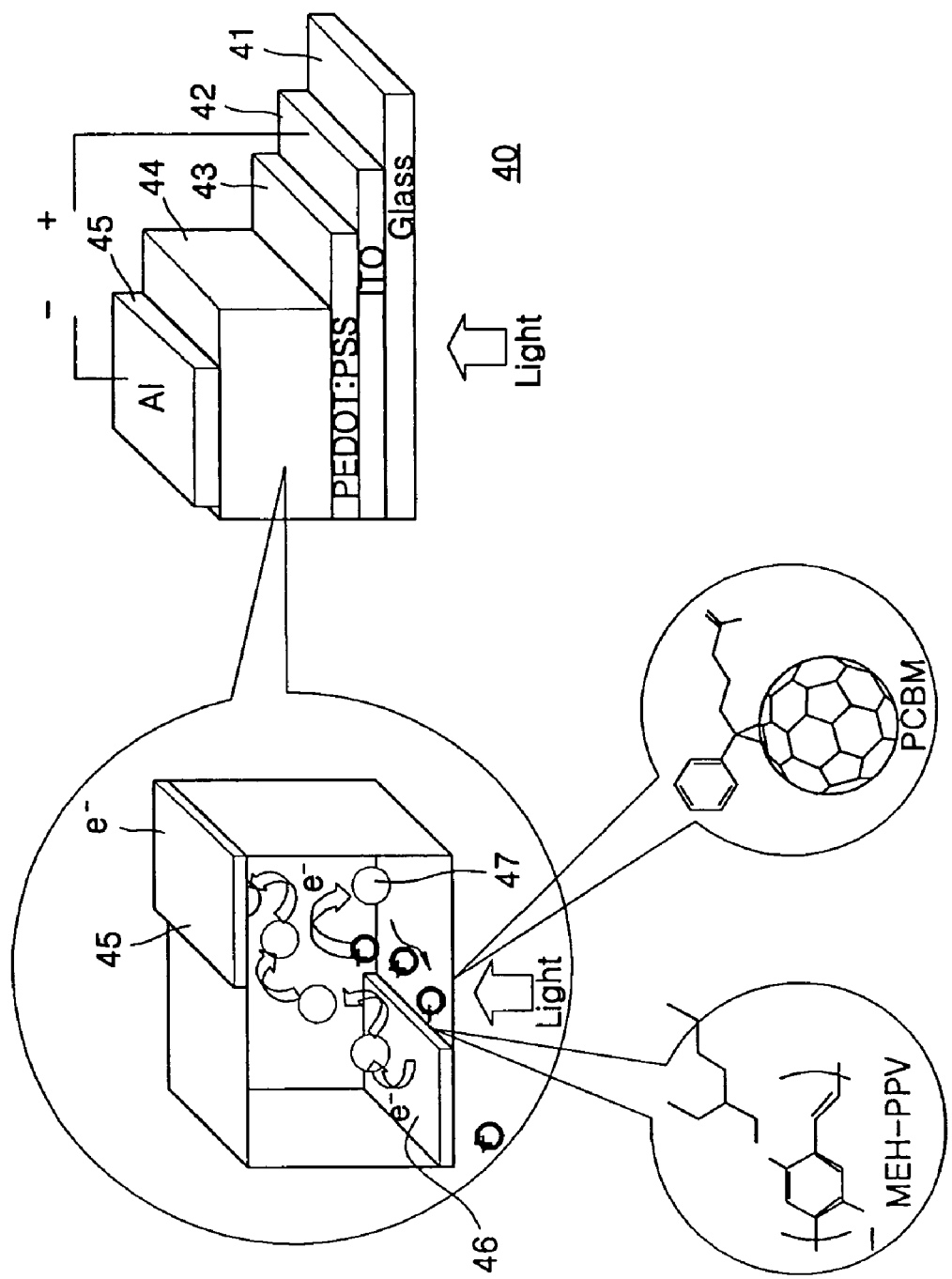
FIG. 2 is a schematic drawing illustrating a structure of a display device functioning as a solar cell and a principle of operation.

To solve this problem, a technique that both the display device and the solar cell are included in single panel has been disclosed. FIG. 2 is a schematic drawing illustrating the structure of a display device that functions as a solar cell and the principle of operation. Referring to FIG. 2, a display device 40 has a structure obtained by sequentially stacking a transparent ITO (indium tin oxide) electrode 42 on a glass substrate 41, a poly elyene dioxty thiospnene/poly stylene sulfonate (PEDOT/PSS) film 43 deposited on the transparent electrode 42, a light emitting layer 44, and an Al electrode 45. Here, the PEDOT/PSS film 43, which is a conductive polymer membrane, serves as a hole injection layer. The light emitting layer 44 has a structure in which a poly (2-methoxy-5-(2'-ethyl-hexyloxy)-p-phenylene vinylene) (hereinafter, MEH-PPV) film 46 is used as a light emitting polymer layer and PCBM 47 is filled as an organic molecular charge transfer material for transporting electrons. Here, the PCBM 47 is a functional derivative of the fullerene molecule having a molecular structure and chemical properties similar to $C_{60}$ (a buckyball shape carbon molecule).

In this type of display device, the MEH-PPV film 46 emits light when a forward voltage is applied to the Al electrode 45 over the transparent ITO electrode 42. As a result, the MEH-PPV film 46 functions as a display device by emitting light through the glass substrate 41. On the contrary, the MEH-PPV film 46 becomes a film having high photosensitivity when the Al electrode 45 and the transparent ITO electrode 42 are biased with a reverse voltage. When light is incident when biased with a reverse voltage, the MEH-PPV film 46 enters a light excited state and then emits charges. As a result, the display device 40 performs as an optical cell when a reverse voltage is applied to the MEH-PPV film 46.

However, the display device 40 of FIG. 2 having the functions of a solar cell of the above structure cannot simultaneously function as both a display device and a solar cell. That is, the display device 40 performs as the display device when a forward voltage is applied and performs as the solar cell when a reverse voltage is applied. Accordingly, the display device 40 has to use stored energy or has to be supplied energy from a separate energy supply device when the display device functions as the display device since both the solar cells and the display device cannot operate simultaneously. In this regard, the solar cell takes on only the role of a supplementary power source for the display device 40.

Figure 3:
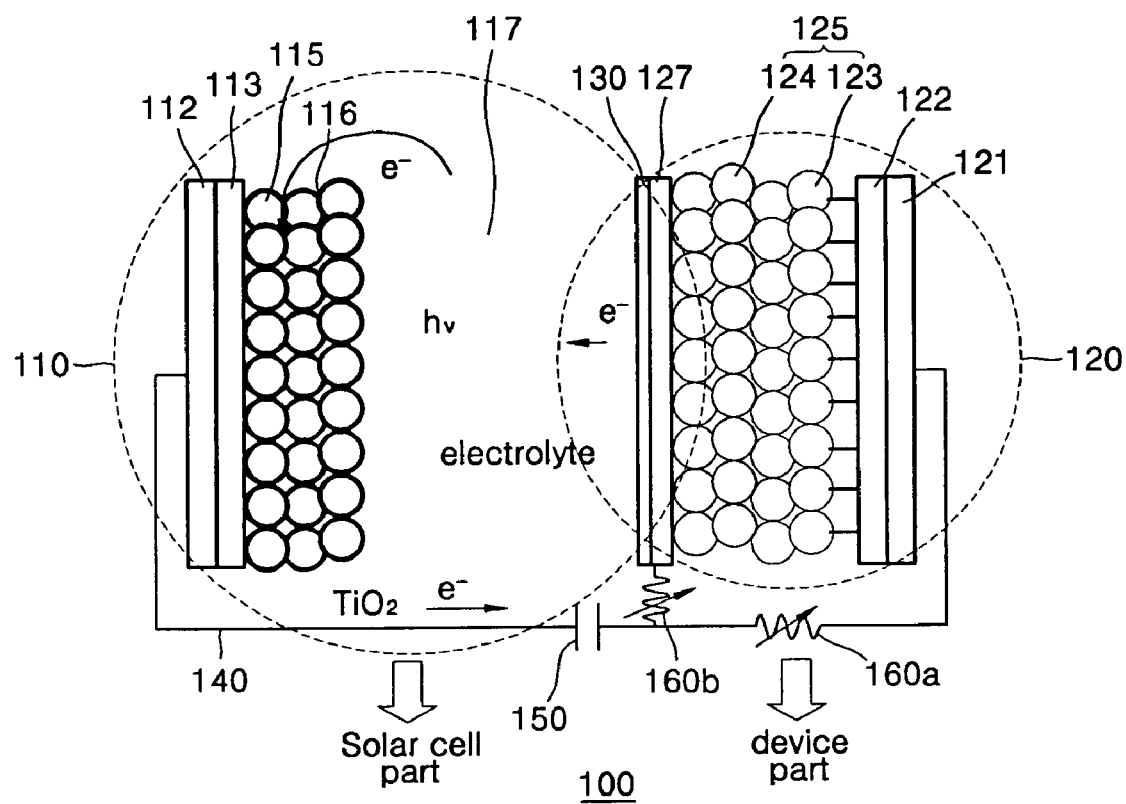
FIG. 3 is a schematic drawing illustrating a structure of a solar cell integrated display device according to the present invention, in which a solar cell is integrated on a side of a substrate of the display device.

Turning now to FIG. 3, FIG. 3 is a schematic drawing illustrating a structure of a solar cell integrated display device 100 according to an embodiment of the present invention. Referring to FIG. 3, a solar cell integrated display device 100 is made up of a solar cell unit 110, a display device unit 120, and a polymer membrane 130. The solar cell integrated display device 100 has a structure in which elements constituting the solar cell unit 110 are stacked on a substrate and elements constituting the display device unit 120 are stacked on the corresponding region of the substrate, and the elements of the solar cell unit 110 and the display device unit 120 are separated by the inorganic polymer membrane 130. The three components, the solar cell unit 110, the display device unit 120, and the polymer membrane 130 will be now described in detail.

The solar cell unit 110 is made up of a transparent electrode 113, such as an ITO (indium tin oxide) electrode stacked on a transparent substrate 112, an optical catalyst 115 coated on the transparent electrode 113, an optical activation material 116 coated on the optical catalyst 115, and an electron transfer electrolyte 117 filled in the spaces of the solar cell unit 110. There is no specific limitation as to what material can be used for forming the transparent substrate 112 as long as the material has a favorable mechanical strength, thermal stability, and transparency. For example, a material, such as glass or a transparent plastic film can be used as the transparent substrate 112.

The optical catalyst 115 is a material causing a strong catalytic action of an oxidation-reduction reaction on a surface when irradiating ultra violet rays. Recently, a titanium oxide group compound such as titanium dioxide ($TiO_2$) is widely used as the optical catalyst 115. An optical catalyst 115 that contains $TiO_2$ particles is an n-type semiconductor, and forms electron-hole pairs when exposed to ultra violet rays. Accordingly, the mobilization of electrons through the $TiO_2$ is then possible.

The optical activation material 116 coated on the optical catalyst 115 is made of a specific dye that absorbs sunlight. Dyes of Ruthenium (Ru) group compounds are used to absorb sunlight. A dye of a ruthenium group, such as ruthenium acid, is used for dying an organic tissue, and the dye easily emits electrons when light is irradiated since it is easily excited. The electrons emitted from the dye move to the transparent electrode 113 through the $TiO_2$ particles.

The electrolyte 117 is an iodine group oxidation-reduction electrolyte that includes iodine (I). The electrolyte 117 revives the dye by supplying electrons received from the polymer membrane 130. Accordingly, a cycle of emitting electrons by the catalyst action of the optical catalyst 115 when exposed to light and receiving electrons through the oxidation-reduction reaction in the dye is continued.

The structure of the display device unit 120 may vary according to type, but generally includes a first electrode 122 on the transparent substrate 121, a light emitting layer 125, and a second electrode 127. The display device unit 120 can be formed of an organic EL (electroluminescent), an inorganic EL, a PDP, an FED, or e-paper.

The EL device is a device functioning as a display by emitting light when holes injected from an anode and electrons injected from a cathode in the light emitting layer 125 recombine. Organic EL and the inorganic EL are classified according to a material used for the light emitting layer 125, and the organic EL is formed of an organic compound and the inorganic EL is formed of an inorganic compound. Generally, the organic EL has superior brightness and response-speed, but has inferior thermal characteristics compared to the inorganic EL. The light emitting layer 125 is made of a dielectric layer 123 and a light emitting material layer 124. The light emitting material layer 124 transfers electrons thus improving the light emitting efficiency.

For forming the display device unit 120, the transparent substrate 121 can be formed of glass or a transparent plastic film like the transparent substrate 112 of the solar cell unit 110. Also, the first electrode 122 is a transparent electrode made of ITO like the transparent electrode 113 of the solar cell unit 110. The first electrode 122 (hereinafter, a first transparent electrode 122) is patterned using a photolithography method after being deposited on the transparent substrate 121. The second electrode of a conventional display device is formed of a metal electrode, such as Al, having a high electric conductivity and being opaque. However, the second electrode 127 in the present invention must be a transparent electrode, such as ITO, so that a portion of light emitted from the light emitting layer 125 of the display device unit 120 can be transmitted to the solar cell unit 110. That is, the two (i.e., both) corresponding electrodes in the display device unit 120 of the present invention are transparent electrodes. Therefore, hereinafter, the second electrode 127 will be called as the second electrode 127 or a second transparent electrode 127.

The polymer membrane 130 or an inorganic-polymer membrane 130 is made of a porous non-humidifying polymer membrane and carbon nano structures that fills the polymer membrane 130. A method of forming the polymer membrane 130 containing the CNT will now be described with reference to FIGS. 4, 5A and 5B.

Figure 4:
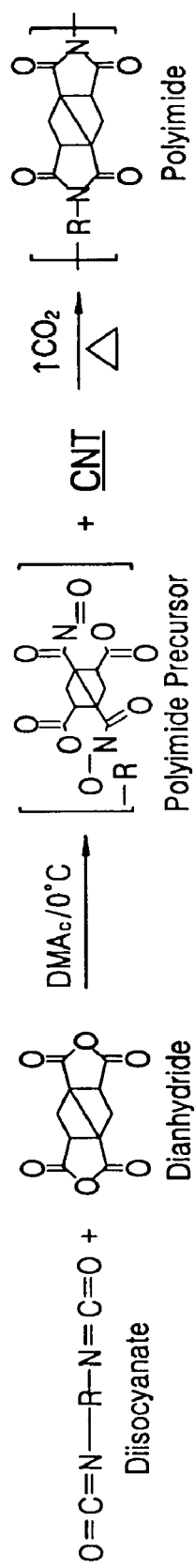
FIG. 4 is an illustration of forming a polymer membrane according to the present invention.
Figure 5A:
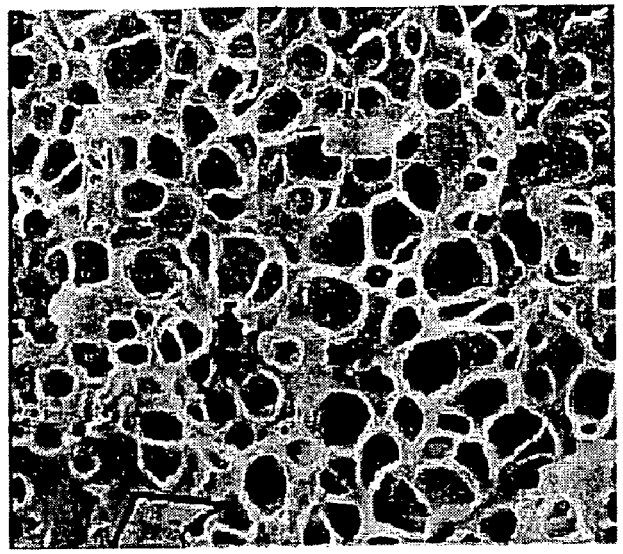
FIG. 5A is a SEM image of a porous polymer membrane according to the present invention.
Figure 5B:
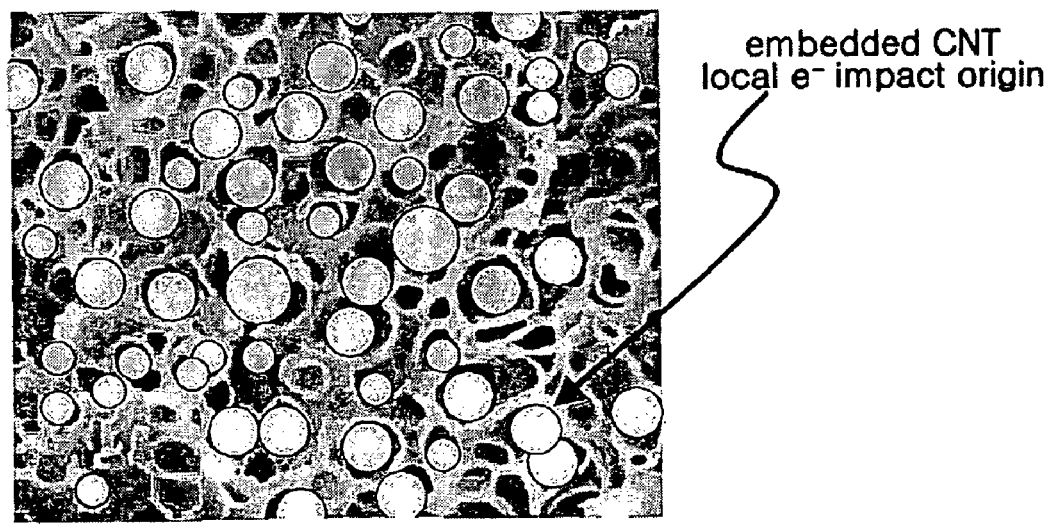
FIG. 5B is an illustration of penetrating CNT into spaces of porous polymer membrane according to the present invention.

Turning now to FIGS. 4, 5A and 5B, FIG. 4 illustrates a process for making the polymer membrane 130 containing carbon nanotubes. Referring to FIG. 4, a powder state of diisocyanate and dianhydride are dissolved in dimethyl actyl amide (DMAc) solvent to form a gel at 0° C. and a pressure of 2-3 atmospheres. At this time, polyimide precursors are formed. After mixing a powder state of CNT with the polyimide precursors, a gel state polyimide precursors are coated on the surface of a substrate or an electrode on which a polymer membrane will reside. Afterward, the coated polyimide precursors are heated slowly while lowering the pressure to one atmosphere so that carbon dioxide ($CO_2$) can be released from the polyimide precursors. The polyimide precursors become foamed, and then a porous polyimide film is formed as illustrated in FIG. 5A. Then, as illustrated in FIG. 5B, an electric channel is formed by penetrating of the fine CNT particles mixed in the polyimide precursors into the pores (or spaces) formed by releasing $CO_2$. Then, the polymer membrane 130 formed in this manner prevents the electrolyte from penetrating into the polymer membrane 130 while accelerating the movement of electrons by an electric field applied on a specific region by the CNT.

Turning now to FIG. 6, FIG. 6 is a schematic drawing illustrating a method of fabricating a solar cell integrated display device according to one embodiment of the present invention where the display device is an organic EL device. Referring to FIG. 6, the display device unit 120 is prepared according to a method of fabricating the display device. In the case of using an organic EL display device, the first transparent electrode 122 is patterned after being deposited on transparent substrate 121. Then, the dielectric layer 123 for transferring electrons and the light emitting material layer 124 for light emitting are sequentially coated on the patterned first transparent electrode 122.

At this time, a planarizing layer (not shown) can be interposed between the dielectric layer 123 and the light emitting material layer 124. The purpose of the planarizing layer is to prevent the dielectric layer 123 from forming a strong local electric field resulting from an uneven surface of the dielectric layer 123. The planarizing layer can be formed of a material such as polyimide or $SiO_2$. The light emitting material film 124 can be formed of a single molecule organic EL such as $Alq_3$ or anthracene, or a foamed polymer organic EL, such as poly(p-henylenevinylene) (PPV), polythiophene (PT) or derivatives of them.

The second transparent electrode 127 is deposited and patterned on the light emitting material film 124. Here, a hole transfer layer (not shown) for improving light emitting efficiency can be coated between the light emitting material film 124 and the second transparent electrode 127.

So far, a method of fabricating the display device unit 120 has been described taking the organic EL device as an example, but the present invention is not limited thereto. Instead of an organic EL device, an inorganic EL, an organic light emitting display or a plasma display panel can be used and still be within the scope of the present invention. However, the one important concept of the present invention is that the cathode and anode in the display device unit 120 must both be transparent.

Figure 7A:
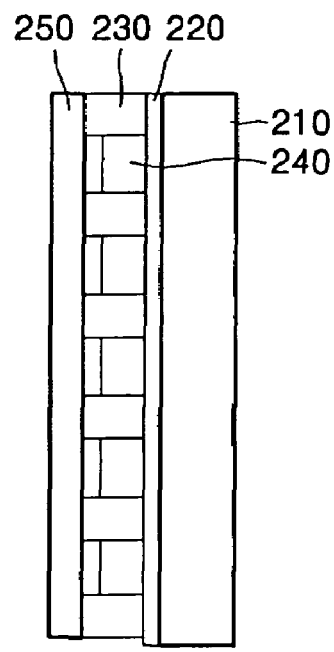
FIGS. 7A and 7B are schematic drawings illustrating structures of a display device unit of a solar cell integrated display device according to the present invention.
Figure 7B:
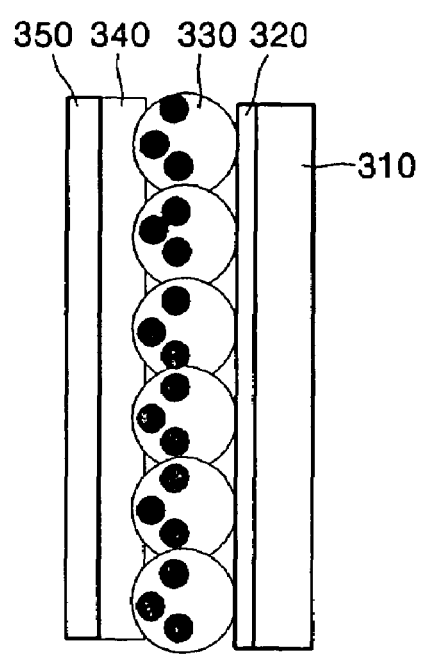

Turning now to FIGS. 7A and 7B, FIGS. 7A and 7B are schematic drawings illustrating other structures of display device units that can be used in a solar cell integrated display device. FIG. 7A illustrates the case where a PDP is used as the display device unit. Referring to FIG. 7A, a first transparent electrode 220 is stacked on a transparent substrate 210, and a fluorescent layer 230 for emitting light is located between a plurality of barrier ribs 240 formed on the first transparent electrode 220. A second transparent electrode 250 is stacked on the barrier ribs 240. Thus, both electrodes 220 and 250 are transparent allowing images to be viewed on one side and allowing the solar cell to receive light from the other side.

FIG. 7B is a case when e-paper is used as the display device unit. Referring to FIG. 7B, the e-paper includes a transparent substrate 310, a first transparent electrode 320, e-ink 330, a planarizing layer 340, and a second transparent electrode 350. In e-ink 330 resides microcapsules in which positively charged white particles and negatively charged black particles are included, and can display black and white colors by changing the locations of the black/white particles according to a direction of a voltage applied. Strictly speaking, the e-paper is not an emissive display device but can be properly used as a display device unit and be combined with a solar cell unit without an additional driving power source, which is an object of the present invention. Though it is not shown, other display devices, such as a FED, can also be used in a solar cell integrated display device with the same principle. However, the present invention will be described with reference to FIG. 6 where an organic EL device is used for convenience of explanation.

Turning back to FIG. 6, in the lower left corner of FIG. 6, in the formation of the organic EL display device unit 120, a polymer membrane 130, formed according to the method described above in conjunction with FIGS. 4, 5A and 5B, is coated on the second transparent electrode 127. As described above, the polymer membrane 130 includes CNT which allows for a smooth flow of electrons and prevents the position of the electrolyte from moving. The polymer membrane 130 is coated to a thickness of a few tens nm to a few hundreds nm, and preferably 10-500 nm. Light from light emitting material layer 124 that transmits through the second transparent electrode 127 to the solar cell unit 110 is attenuated very little by the polymer membrane because the polymer membrane is designed to be very thin.

Referring now to the upper right corner of FIG. 6, the solar cell unit 110 is formed. The transparent electrode 113 (hereinafter, the third transparent electrode) is deposited on the transparent substrate 112. Afterward, an optical catalyst powder, i.e., $TiO_2$ particles 115 and a dye 116 formed of an optical activation material are sequentially coated on the third transparent electrode 113. The manufactured solar cell unit 110 is then assembled to the display device unit 120 at a predetermined distance, and the electrolyte 117 is filled into the space of the solar cell unit 110 formed by the predetermined distance. The solar cell unit 110 is then sealed. Then, the fabrication of the solar cell integrated display device 100 according to the present invention is then complete.

Figure 8:
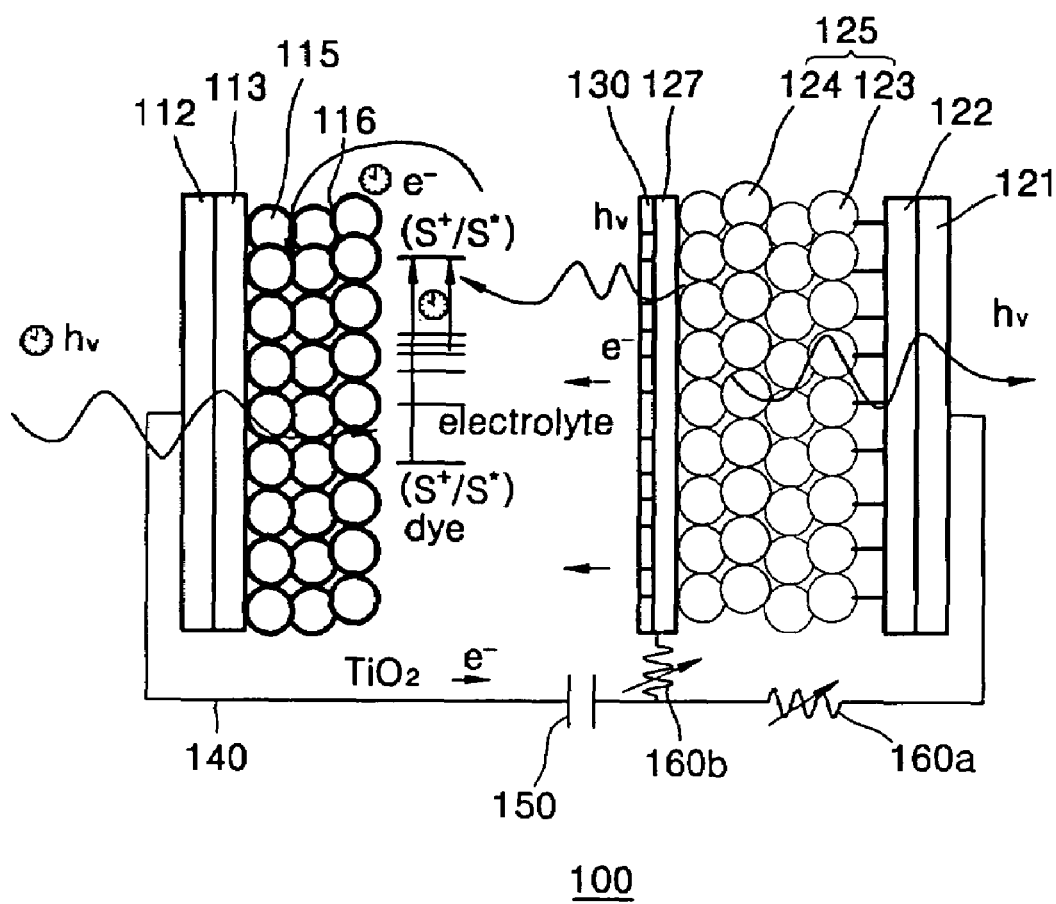
FIG. 8 is a schematic drawing illustrating a principle of operation of a solar cell integrated display device according to the present invention.

Turning now to FIG. 8, FIG. 8 is a schematic drawing illustrating a principle of operation of a solar cell integrated display device 100 according to the present invention. Referring to FIG. 8, when the sunlight shines into the solar cell unit 110 through the transparent substrate 112 and the third transparent electrode 113, the state of electrons in the optical activation material 116 moves from a ground state to an excited state. The excited electrons emitted from the optical activation material 116 are transferred to the third transparent electrode 113 through the $TiO_2$ particles in optical catalyst 115. This transfer of electrons generates an electromotive force. The electromotive force makes current flow to the display device unit 120 through a wire 140. When the display device unit 120 is in an off-state, the electricity is stored in a capacitor 150 for later use.

A voltage and current in the display device unit 120 are controlled through variable resistors 160a and 160b connected to the first transparent electrode 122 and the second transparent electrode 127 respectively. Although FIGS. 3 and 8 show the wire 140 as being attached to transparent substrates 112 and 121, it is to be understood that in reality, wire 140 is attached to transparent electrodes 113 and 122, not to substrates 112 and 121. FIGS. 3 and 8 show wire 140 as being attached to the substrates for simplicity. It is to be understood that the wire 140 is really attached to the electrodes, not to the substrates.

The controlled electromotive force induces a light emission of the display device unit 120. About 50% of the light emitted from the display device unit 120 provides transmitting type visual information through the first transparent electrode 122 of a side of the transparent substrate 121. The remaining about 50% of the light enters into the solar cell unit 110 by passing through the second transparent electrode 127 and the polymer membrane 130. The light that enters into the solar cell unit 110 from display device unit 120 is used for generating electrical energy in the solar cell unit 110.

Meanwhile, a local electron impact effect occurs due to the electric field formed on a specific region by the fine CNT particles. The electrons transferred from the first transparent electrode 122 to the second transparent electrode 127 are supplied to the electrolyte 117 of the solar cell unit 110 by accelerating by the local electron impact effect in the polymer membrane 130. That is, the electrons flow again into the electrolyte 117 by forming a closed loop. The electrolyte 117, being an iodine group oxidation-reduction electrolyte containing iodine (I), re-supplies electrons to the optical activation material 116. The optical activation material 116, which emits electrons when excited by sunlight, is reduced by the received electrons, and re-emits electrons when excited by the sunlight.

Also, the incident light from the display device unit 120 excites electrons located on a defect site or a doped site of the optical activation material 116. Then, electrons are emitted from the optical activation material 116. Accordingly, the solar cell unit 110 generates electricity not only from sunlight but also the light from the display device unit 120. Thus, it is possible to reuse some of the energy consumed by the display device unit 120. Particularly, the sunlight has high energy level in the ultra violet region and the incident light from the display device unit 120 has a relatively lower energy level than sunlight, therefore, the solar cell unit 110 can utilize a wide range of spectrum.

According to the present invention, the solar cell integrated display device can effectively utilize the energy of the display device unit, thus increasing energy consumption efficiency. Consumed energy can be reused by using a portion of light generated from the display device unit 120, this portion being light that is not viewed by a viewer. Accordingly, there is an advantage of removing an additional power supply unit to the display device unit.

A smooth electron flow from the display device unit to the electrolyte region of the solar cell unit can be achieved by generating a local electron impact effect through an electric field formed on a local region by the CNT mixed in the polymer membrane. Instead of separately manufacturing the solar cell and the display device, the present invention forms the solar cell and the display device units together between two substrates. Therefore, the volume of the solar cell integrated display device according to the present invention can be reduced by almost to a 50%. Also, the numbers of packaging can be reduced by two to one, thus reducing packaging costs, eliminating complicated wiring, thus preventing the generation of electromagnetic interference. With the concepts of the present invention, the application of the solar cell integrated display device to a variety of mobile devices that use an emissive display device such as notebooks, e-books, PDAs, or mobile phones, will be much easier.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. A solar cell integrated display device, comprising:
   an emissive display device unit comprising a first transparent substrate, a first transparent electrode arranged on the first transparent substrate, a second transparent electrode facing the first transparent electrode, and a light emitting layer arranged between the first transparent electrode and the second transparent electrode;
   a polymer membrane arranged on the second transparent electrode, the polymer membrane comprising CNT; and
   a solar cell unit arranged on the polymer membrane and adapted to supply power to the display device unit.

2. The solar cell integrated display device of claim 1, the polymer membrane that comprises CNT is formed by the process comprising:
   forming polyimide precursors by dissolving a powder state of diisocyanate and a powder state of dianhydride in DMAc solvent;
   mixing CNT powder with the polyimide precursors;
   coating the polyimide precursors that comprise the CNT onto the second transparent electrode; and
   heating the coated polyimide precursors causing $CO_2$ to be released from the polyimide precursors and causing the CNT to penetrate into the pores where the $CO_2$ has been released from.

3. The solar cell integrated display device of claim 2, the forming the polyimide precursors is performed at a temperature of about 0° C. under a pressure of 2-3 atmospheres.

4. The solar cell integrated display device of claim 2, the heating of the coated polyimide precursors is performed under one atmosphere of pressure.

5. The solar cell integrated display device of claim 2, a thickness of the polymer membrane is 10-500 nm.

6. The solar cell integrated display device of claim 1, the solar cell unit comprises:
   a second transparent substrate;
   a third transparent electrode arranged on the second transparent substrate;
   an optical catalyst arranged on the third transparent electrode;
   an optical activation material adapted to emits electrons when excited by sunlight and arranged on the optical catalyst; and
   an electrolyte that transfers electrons arranged adjacent to the optical activation material.

7. The solar cell integrated display device of claim 6, the second transparent substrate of the solar cell unit being separated by a predetermined distance from the polymer membrane, the electrolyte being arranged in a space between the second transparent substrate and the polymer membrane.

8. The solar cell integrated display device of claim 6, the optical catalyst comprises an oxide of the titanium group.

9. The solar cell integrated display device of claim 6, further comprising:
   a first variable resistor connected to the first transparent electrode; and
   a second variable resistor connected to the second transparent electrode, the first and the second variable resistors being adapted to control a voltage and a current applied to the display device unit from the third transparent electrode of the solar cell unit.

10. A solar cell integrated display device, comprising:
    an emissive display device unit comprising a first transparent substrate, a first transparent electrode arranged on the first transparent substrate, a second transparent electrode facing the first transparent electrode, and a light emitting layer arranged between the first transparent electrode and the second transparent electrode;
    a solar cell unit attached to the emissive display device, the solar cell unit being adapted to supply power to the display device unit, the solar cell unit being adapted to receive light generated in the light emitting layer and convert said received light into power that is used to power the display device unit; and
    a polymer membrane arranged an the second transparent electrode between the emissive display device unit and the solar cell unit, the polymer membrane comprising CNT.

11. The solar cell integrated display device of claim 10, both the display device unit and the solar cell unit being designed to operate simultaneously.

12. The solar cell integrated display device of claim 10, the solar cell integrated display device being absent a connection to an external power source.

13. The solar cell integrated display device of claim 1, the polymer membrane being adapted to allow transmission of light from the emissive display device unit to the solar cell unit.

14. The solar cell integrated display device of claim 13, the polymer membrane further being adapted to provide for a smooth flow of electrons and to prevent electrolyte from the solar cell unit from leaking.

15. The solar cell integrated display device of claim 1, the polymer membrane being between 10 and 500 nm thick.

16. The solar cell integrated display device of claim 10, the first transparent substrate being on a side of the emissive display device unit furthest from the solar cell unit.

17. The solar cell integrated display device of claim 10, the first transparent substrate facing away from the solar cell unit.

* * * * *